(12) United States Patent
Yamada

(10) Patent No.: US 8,581,300 B2
(45) Date of Patent: Nov. 12, 2013

(54) COMPOUND SEMICONDUCTOR DEVICE AND METHOD OF MANUFACTURING THE SAME

(75) Inventor: Atsushi Yamada, Isehara (JP)

(73) Assignee: Fujitsu Limited, Kawasaki (JP)

(\*) Notice: Subject to any disclaimer, the term of this patent is extended or adjusted under 35 U.S.C. 154(b) by 0 days.

(21) Appl. No.: 13/546,160

(22) Filed: Jul. 11, 2012

(65) Prior Publication Data

US 2013/0076443 A1    Mar. 28, 2013

(30) Foreign Application Priority Data

Sep. 26, 2011 (JP) ................. 2011-209172

(51) Int. Cl.
*H01L 29/66* (2006.01)

(52) U.S. Cl.
USPC ............ 257/194; 257/E29.247; 257/E29.248; 257/E29.249; 257/E29.252; 257/E21.403; 257/E21.407

(58) Field of Classification Search
USPC ........... 257/194, E29.247, E29.248, E29.249, 257/E29.252, E21.407
See application file for complete search history.

(56) References Cited

U.S. PATENT DOCUMENTS

| | | | |
|---|---|---|---|
| 7,859,021 B2 | 12/2010 | Kaneko | |
| 7,985,987 B2 | 7/2011 | Kaneko | |
| 8,076,698 B2 | 12/2011 | Ueda | |
| 2007/0164315 A1* | 7/2007 | Smith et al. | 257/194 |
| 2008/0210988 A1 | 9/2008 | Twynam | |
| 2009/0057720 A1 | 3/2009 | Kaneko | |
| 2009/0121775 A1 | 5/2009 | Ueda | |
| 2011/0062438 A1 | 3/2011 | Kaneko | |
| 2012/0280233 A1* | 11/2012 | Lee et al. | 257/57 |

FOREIGN PATENT DOCUMENTS

| | | |
|---|---|---|
| JP | 2007-19309 A1 | 1/2007 |
| JP | 2008-124374 A | 5/2008 |
| JP | 2009-76845 A1 | 4/2009 |
| JP | 2011-171595 | 9/2011 |

OTHER PUBLICATIONS

Notice of Preliminary Rejection mailed May 28, 2013, from the Korean Intellectual Property Office for counterpart application No. 10-2012-83214, with English translation.

\* cited by examiner

*Primary Examiner* — Michael Lebentritt
*Assistant Examiner* — Aaron Dehne
(74) *Attorney, Agent, or Firm* — Kratz, Quintos & Hanson, LLP

(57) ABSTRACT

An embodiment of a compound semiconductor device includes: a substrate; an electron channel layer and an electron supply layer formed over the substrate; a gate electrode, a source electrode and a drain electrode formed on or above the electron supply layer; and a p-type semiconductor layer formed between the electron supply layer and the gate electrode. The p-type semiconductor layer contains, as a p-type impurity, an element same as that being contained in at least either of the electron channel layer and the electron supply layer.

14 Claims, 13 Drawing Sheets

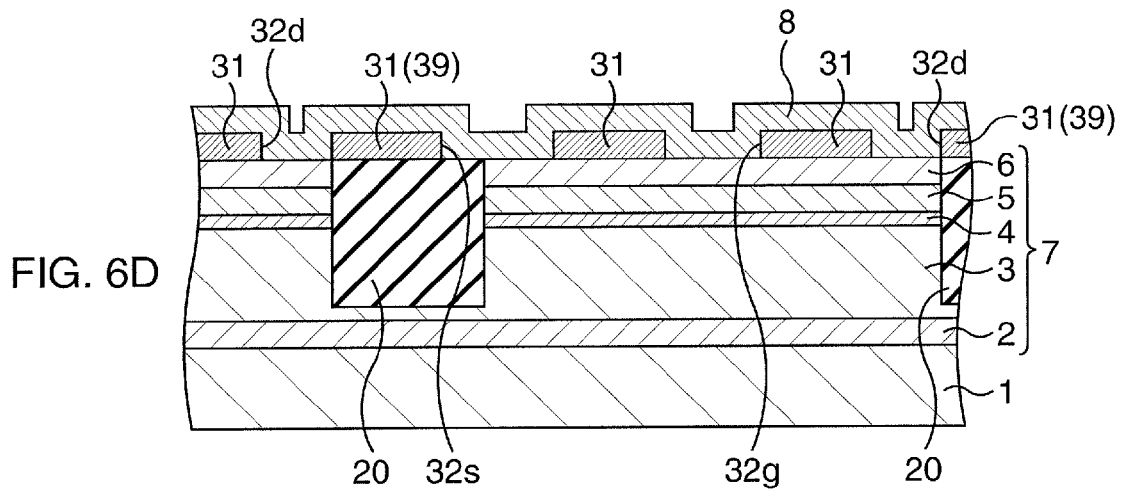
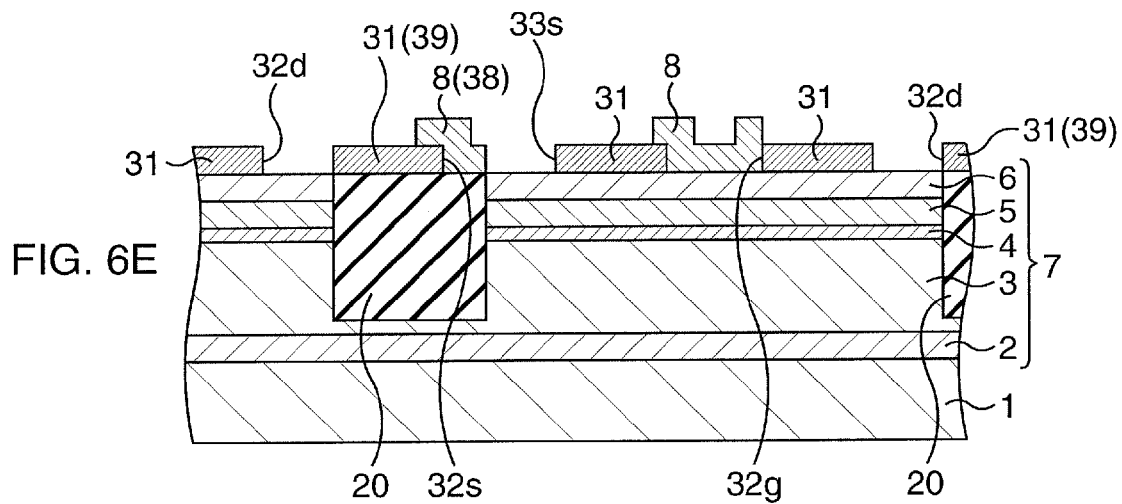
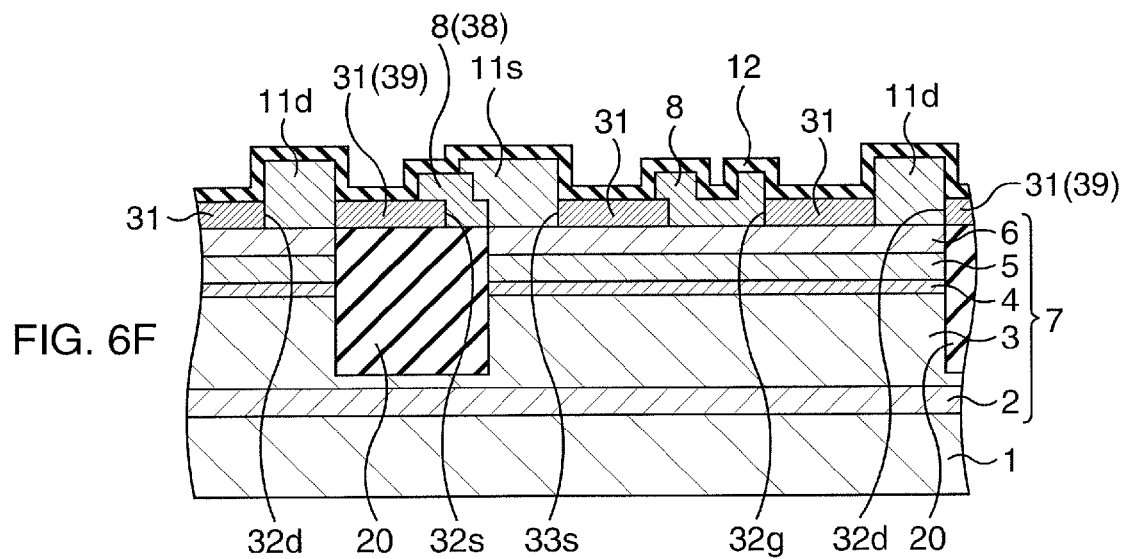

COMPOUND SEMICONDUCTOR DEVICE AND METHOD OF MANUFACTURING THE SAME

CROSS-REFERENCE TO RELATED APPLICATIONS

This application is based upon and claims the benefit of priority of the prior Japanese Patent Application No. 2011-209172, filed on Sep. 26, 2011, the entire contents of which are incorporated herein by reference.

FIELD

The embodiments discussed herein are related to a compound semiconductor device and a method of manufacturing the same.

BACKGROUND

In recent years, there has been vigorous development of high-breakdown voltage, high-output compound semiconductor devices, making use of advantages of nitride-based compound semiconductor including high saturation electron mobility and wide band gap. The development is directed to field effect transistors such as high electron mobility transistors (HEMTs), for example. Among them, a GaN-based HEMT having an AlGaN layer as an electron supply layer attracts a lot of attention. In the GaN-based HEMT, lattice distortion occurs in the AlGaN layer due to difference in lattice constants between AlGaN and GaN, the distortion induces piezo polarization therealong, and thereby generates a high-density, two-dimensional electron gas, in the upper portion of the GaN layer laid under the AlGaN layer. This configuration ensures high output.

However, it is difficult to obtain normally-off transistors due to high density of the two-dimensional electron gas. Investigations into various techniques have therefore been directed to solve the problem. Conventional proposals include a technique of disconnecting the two-dimensional electron gas by etching a portion of the electron supply layer just below the gate electrode, and a technique of vanishing the two-dimensional electron gas by forming a p-type GaN layer containing Mg as an acceptor impurity between the gate electrode and the electron supply layer.

Etching of the portion of the electron supply layer just below the gate electrode will, however, damage the electron channel layer, to thereby induce problems of increase in sheet resistance and increase in leakage current. On the other hand, formation of the p-type GaN layer containing Mg will elevate resistivity. In this way, conventional efforts to obtain the normally-off transistors have degraded other characteristics of the transistors.

[Patent Literature 1] Japanese Laid-Open Patent Publication No. 2009-076845

[Patent Literature 2] Japanese Laid-Open Patent Publication No. 2007-019309

SUMMARY

According to an aspect of the embodiments, a compound semiconductor device includes: a substrate; an electron channel layer and an electron supply layer formed over the substrate; a gate electrode, a source electrode and a drain electrode formed on or above the electron supply layer; and a p-type semiconductor layer formed between the electron supply layer and the gate electrode. The p-type semiconductor layer contains, as a p-type impurity, an element same as that being contained in at least either of the electron channel layer and the electron supply layer.

According to another aspect of the embodiments, a method of manufacturing a compound semiconductor device includes: forming an electron channel layer and an electron supply layer over a substrate; forming a p-type semiconductor layer above the electron supply layer; forming a source electrode and a drain electrode on or above the electron supply layer, at positions in planar view placing the p-type semiconductor layer in between; and forming a gate electrode on the p-type semiconductor layer. The p-type semiconductor layer contains, as a p-type impurity, an element same as that being contained in at least either of the electron channel layer and the electron supply layer.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 6A to 6H are cross sectional views illustrating, in sequence, a method of manufacturing the compound semiconductor device according to the fourth embodiment;

DESCRIPTION OF EMBODIMENTS

The present inventor extensively investigated into the reasons why the resistivity elevated, when the p-type GaN layer containing Mg as an acceptor impurity is formed, in prior arts. Then, it was found out that, in the process of growth of the p-type GaN layer, Mg added as the acceptor impurity excessively diffuses into the electron channel layer beyond the electron supply layer, to thereby vanish the two-dimensional electron gas (2DEG) not only in a portion right under the gate electrode, but also in a portion where the 2DEG are required to be maintained. In short, prior art is disadvantageous to lower the 2DEG concentration, in association with diffusion of Mg contained in the p-type GaN layer.

Embodiments will be detailed below, referring to the attached drawings.

(first embodiment)

Figure 1:
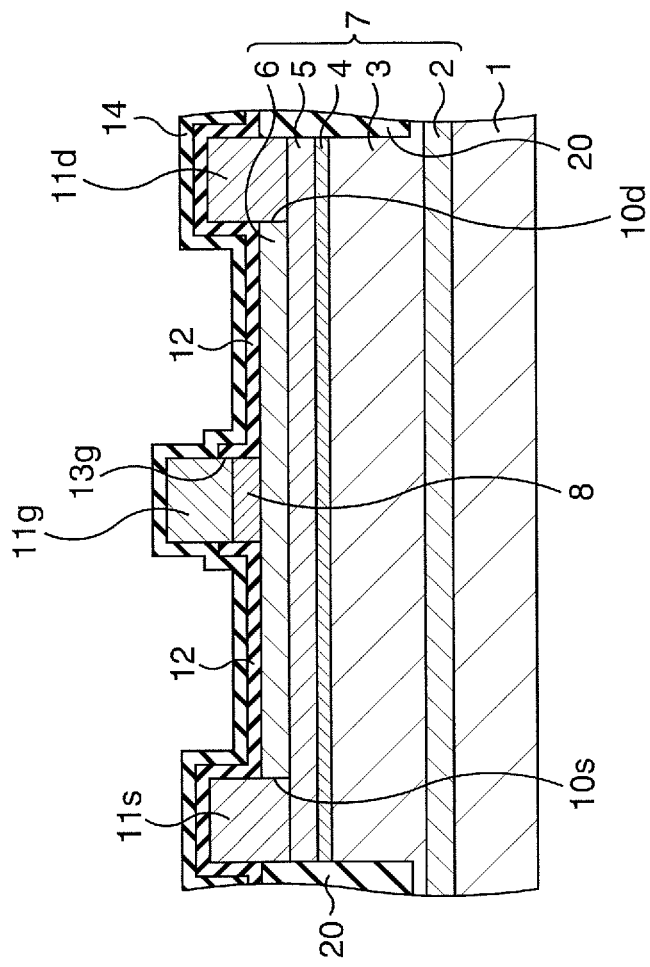
FIG. 1 is a cross sectional view illustrating a structure of a compound semiconductor device according to a first embodiment.

A first embodiment will be described. FIG. 1 is a cross sectional view illustrating a structure of a GaN-based HEMT (compound semiconductor device) according to the first embodiment.

In the first embodiment, as illustrated in FIG. 1, a compound semiconductor stacked structure 7 is formed over a substrate 1 such as Si substrate. The compound semiconductor stacked structure 7 includes a nucleation layer 2, an electron channel layer 3, a spacer layer 4, an electron supply layer 5 and a cap layer 6. The nucleation layer 2 may be an AlN layer of approximately 100 nm thick, for example. The electron channel layer 3 may be an i-GaN layer of approximately 3 μm thick, which is not intentionally doped with an impurity, for example. The spacer layer 4 may be an i-AlGaN layer of approximately 5 nm thick, which is not intentionally doped with an impurity, for example. The electron supply layer 5 may be an n-type AlGaN (n-AlGaN) layer of approximately 30 nm thick, for example. The cap layer 6 may be an n-type GaN (n-GaN) layer of approximately 10 nm thick, for example. The electron supply layer 5 and the cap layer 6 may be doped with approximately $5 \times 10^{18}/cm^3$ of Si as an n-type impurity, for example.

An element isolation region 20 which defines an element region is formed in the compound semiconductor stacked structure 7. In the element region, openings 10s and 10d are formed in the cap layer 6. A source electrode 11s is formed in the opening 10s, and a drain electrode 11d is formed in the opening 10d. A p-type semiconductor layer 8 is formed on the cap layer 6 and in the region thereof in planar view between the source electrode 11s and the drain electrode 11d. The p-type semiconductor layer 8 may be an amorphous SiC layer of approximately 100 nm thick, doped with approximately $5 \times 10^{18}/cm^3$ of Al or Ga as a p-type impurity, for example. An insulating film 12 is formed so as to cover the source electrode 11s and the drain electrode 11d over the cap layer 6. An opening 13g is formed in the insulating film 12 so as to expose the p-type semiconductor layer 8, and a gate electrode 11g is formed in the opening 13g. An insulating film 14 is formed so as to cover the gate electrode 11g over the insulating film 12. While materials for the insulating films 12 and 14 are not specifically limited, a Si nitride film may be used, for example.

In the GaN-based HEMT thus configured, the 2DEG disappears in a portion thereof right under the gate electrode, since the amorphous SiC layer containing approximately $5 \times 10^{18}/cm^3$ of Al or Ga is provided, as the p-type semiconductor layer 8, between the gate electrode 11g and the electron supply layer 5. Accordingly, the normally-off operation can be achieved. Besides, in the process of forming the amorphous SiC layer, the dopant Al or Ga is less likely to diffuse into the electron supply layer 5 and the electron channel layer 3, and will not vanish the required 2DEG even though it may otherwise diffuse thereinto. This is because Al and Ga are elements contained in the electron supply layer 5 and the electron channel layer 3. Accordingly, a sufficient concentration of 2DEG can be maintained, and thereby the resistivity can be suppressed to a low level.

Since the amorphous SiC layer can be formed at a lower temperature as compared with a GaN layer containing Mg, so that the crystal structure of the compound semiconductor stacked structure 7, for example, already formed prior to the p-type semiconductor layer 8, is less likely to be deteriorated.

Next, a method of manufacturing the GaN-based HEMT (compound semiconductor device) according to the first embodiment will be explained. FIG. 2A to FIG. 2I are cross sectional views illustrating, in sequence, the method of manufacturing the GaN-based HEMT (compound semiconductor device) according to the first embodiment.

Figure 2A:
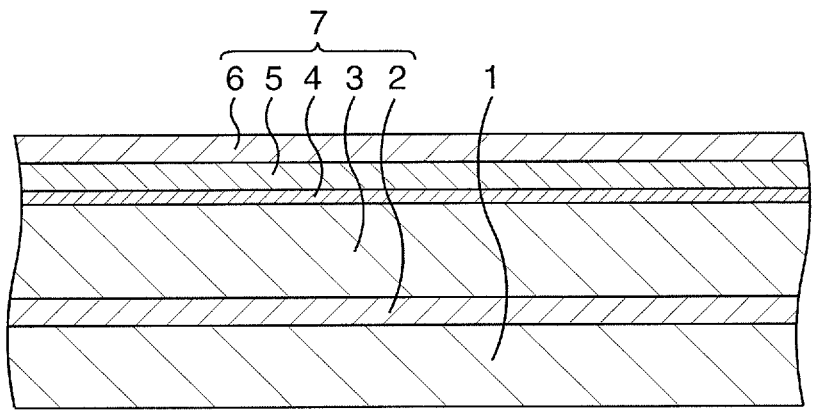
FIGS. 2A to 2I are cross sectional views illustrating, in sequence, a method of manufacturing the compound semiconductor device according to the first embodiment.

First, as illustrated in FIG. 2A, the compound semiconductor stacked structure 7 is formed over the substrate 1. In the process of forming the compound semiconductor stacked structure 7, the nucleation layer 2, the electron channel layer 3, the spacer layer 4, the electron supply layer 5 and the cap layer 6 may be formed by metal organic vapor phase epitaxy (MOVPE), for example. In the process of forming the compound semiconductor layers, a mixed gas of trimethylaluminum (TMA) gas as an Al source, trimethylgallium (TMG) gas as a Ga source, and ammonia ($NH_3$) gas as a N source, may be used. In the process, on/off of supply and flow rates of trimethylaluminum gas and trimethylgallium gas are appropriately set, depending on compositions of the compound semiconductor layers to be grown. Flow rate of ammonia gas, which is common to all compound semiconductor layers, may be set to approximately 100 ccm to 10 LM. Growth pressure may be adjusted to approximately 50 Torr to 300 Torr, and growth temperature may be adjusted to approximately 1000° C. to 1200° C., for example. In the process of growing the n-type compound semiconductor layers, Si may be doped into the compound semiconductor layers by adding $SiH_4$ gas, which contains Si, to the mixed gas at a predetermined flow rate, for example. Dose of Si is adjusted to approximately $1 \times 10^{18}/cm^3$ to $1 \times 10^{20}/cm^3$, and to $5 \times 10^{18}/cm^3$ or around, for example.

Figure 2B:
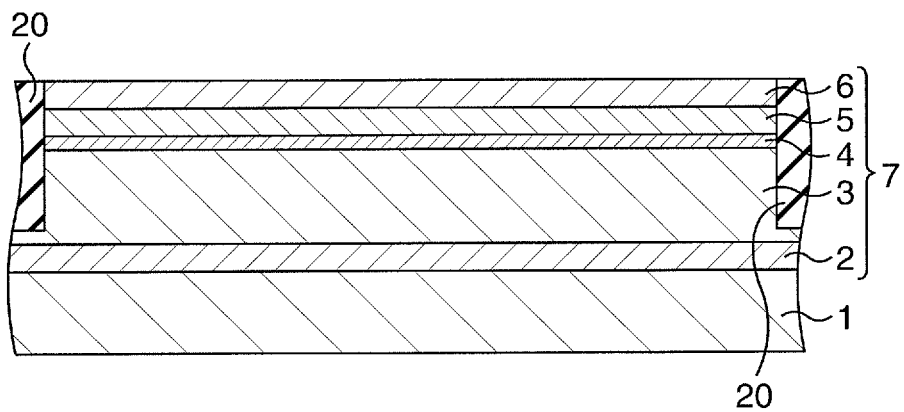

Next, as illustrated in FIG. 2B, the element isolation region 20 which defines the element region is formed in the compound semiconductor stacked structure 7. In the process of forming the element isolation region 20, for example, a photoresist pattern is formed over the compound semiconductor stacked structure 7 so as to selectively expose region where the element isolation region 20 is to be formed, and ion such as Ar ion is implanted through the photoresist pattern used as a mask. Alternatively, the compound semiconductor stacked structure 7 may be etched by dry etching using a chlorine-containing gas, through the photoresist pattern used as an etching mask.

Figure 2C:
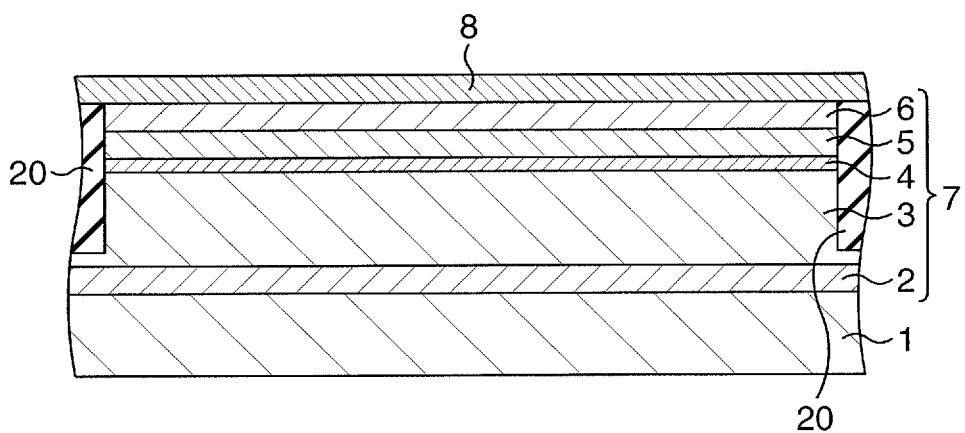

Thereafter, as illustrated in FIG. 2C, the p-type semiconductor layer 8 is formed over the entire surface. The p-type semiconductor layer 8 may be, for example, an amorphous SiC layer doped with approximately $1 \times 10^{18}/cm^3$ to $1 \times 10^{20}/cm^3$ of Al, $5 \times 10^{18}/cm^3$ of Al for example. The p-type semiconductor layer 8 may be formed by a catalytic chemical vapor deposition process (hot-wire CVD) using a mixed gas of $SiH_4$ (silane) and $CH_4$ (methane) as a source material, for example. Once the p-type semiconductor layer 8 is formed, the concentration of the 2DEG existing in the surficial portion of the electron channel layer 3 largely decreases.

Figure 2D:
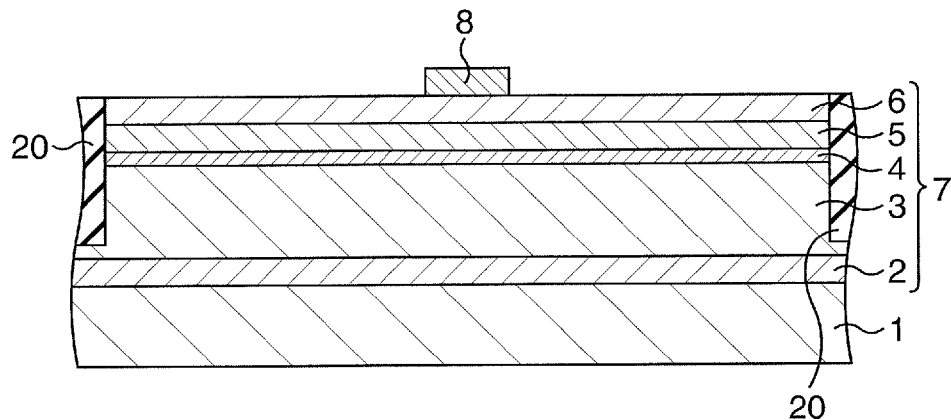

Next, as illustrated in FIG. 2D, the p-type semiconductor layer 8 is removed, but excluding a portion thereof on which the gate electrode is to be formed. In other words, the p-type semiconductor layer 8 is patterned. In the patterning, for example, a photoresist pattern is formed so as to cover a portion where the p-type semiconductor layer 8 will be left unremoved, and the residual portion of the p-type semiconductor layer 8 is then removed by dry etching while using the photoresist pattern as an etching mask. As a result, the 2DEG remains to be considerably decreased in the concentration, or to vanish, for example, below the remained portion of the p-type semiconductor layer 8, whereas the 2DEG appears again at a high concentration in the surficial portion of the electron channel layer 3, which is comparable to the level having been attained before the p-type semiconductor layer 8 is formed, in the region where the p-type semiconductor layer 8 is removed.

Figure 2E:
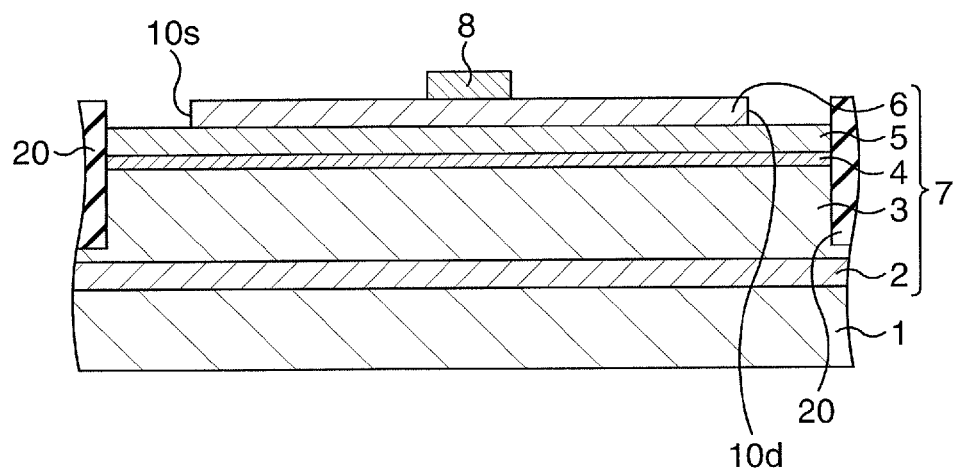

Next, as illustrated in FIG. 2E, the openings 10s and 10d are formed in the cap layer 6. In the process of forming the openings 10s and 10d, for example, a photoresist pattern is formed over the compound semiconductor stacked structure 7 so as to expose regions where the openings 10s and 10d are to be formed, and the cap layer 6 is etched by dry etching using a chlorine-containing gas, through the photoresist pattern used as an etching mask.

Figure 2F:
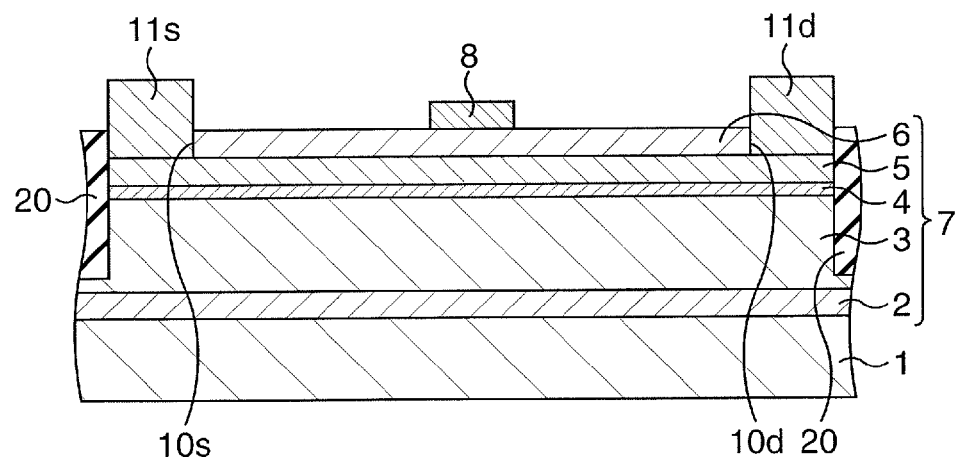

Next, as illustrated in FIG. 2F, the source electrode 11s is formed in the opening 10s, and the drain electrode 11d is formed in the opening 10d. The source electrode 11s and the drain electrode 11d may be formed by a lift-off process, for example. More specifically, a photoresist pattern is formed so as to expose regions where the source electrode 11s and the drain electrode 11d are to be formed, a metal film is formed over the entire surface by an evaporation process while using the photoresist pattern as a growth mask, for example, and the photoresist pattern is then removed together with the portion of the metal film deposited thereon. In the process of forming the metal film, for example, a Ta film of approximately 20 nm thick may be formed, and an Al film of approximately 200 nm thick may be then formed. The metal film is then annealed, for example, in a nitrogen atmosphere at 400° C. to 1000° C. (at 550° C., for example) to thereby ensure ohmic characteristic.

Figure 2G:
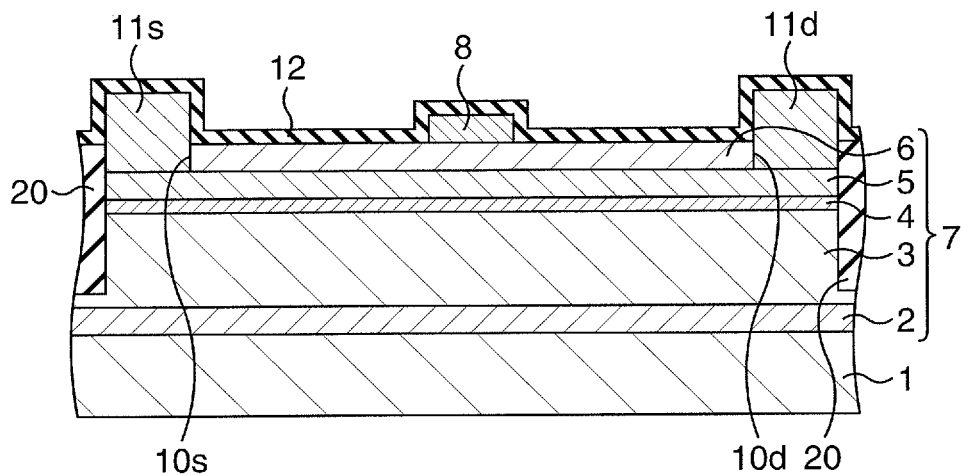

Then as illustrated in FIG. 2G, the insulating film 12 is formed over the entire surface. The insulating film 12 is preferably formed by atomic layer deposition (ALD), plasma-assisted chemical vapor deposition (CVD), or sputtering.

Figure 2H:
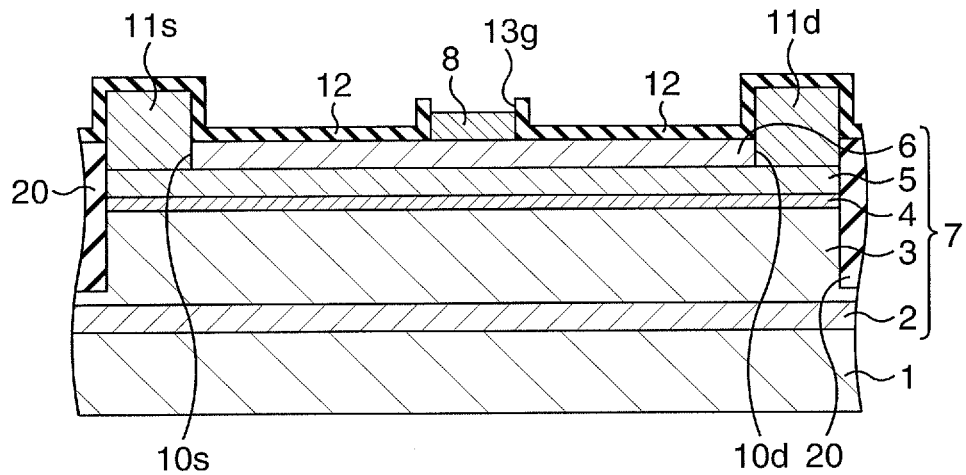

Next, as illustrated in FIG. 2H, the opening 13g is formed in the insulating film 12, so as to expose therein the p-type semiconductor layer 8.

Figure 2I:
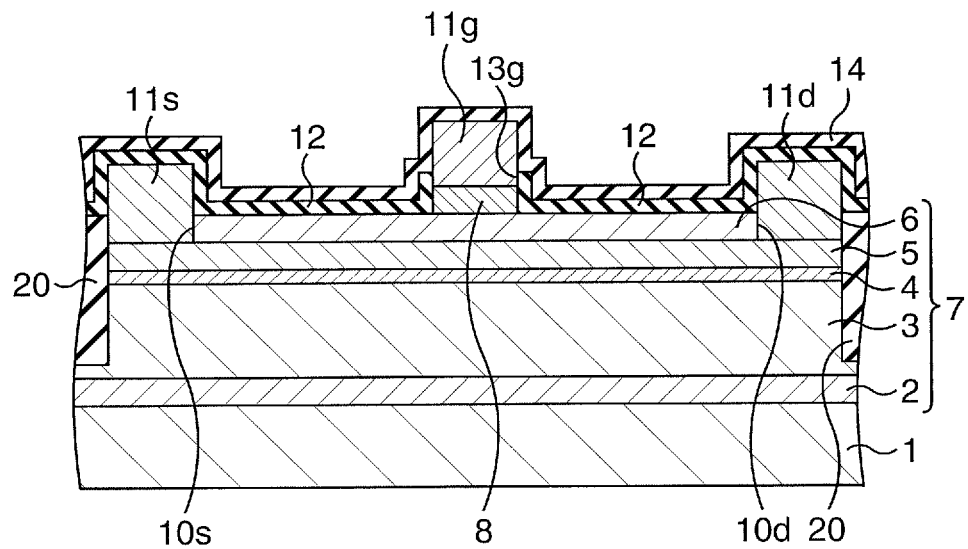

Next, as illustrated in FIG. 2I, the gate electrode 11g is formed in the opening 13g. The gate electrode 11g may be formed by a lift-off process, for example. More specifically, a photoresist pattern is formed so as to expose a region where the gate electrode 11g is to be formed, a metal film is formed over the entire surface by an evaporation process while using the photoresist pattern as a growth mask, for example, and the photoresist pattern is then removed together with the portion of the metal film deposited thereon. In the process of forming the metal film, for example, a Ni film of approximately 30 nm thick may be formed, and a Au film of approximately 400 nm thick may be then formed. Thereafter, the insulating film 14 is formed over the insulating film 12 so as to cover the gate electrode 11g.

The GaN-based HEMT according to the first embodiment may be thus manufactured.

(Second Embodiment)

Figure 3:
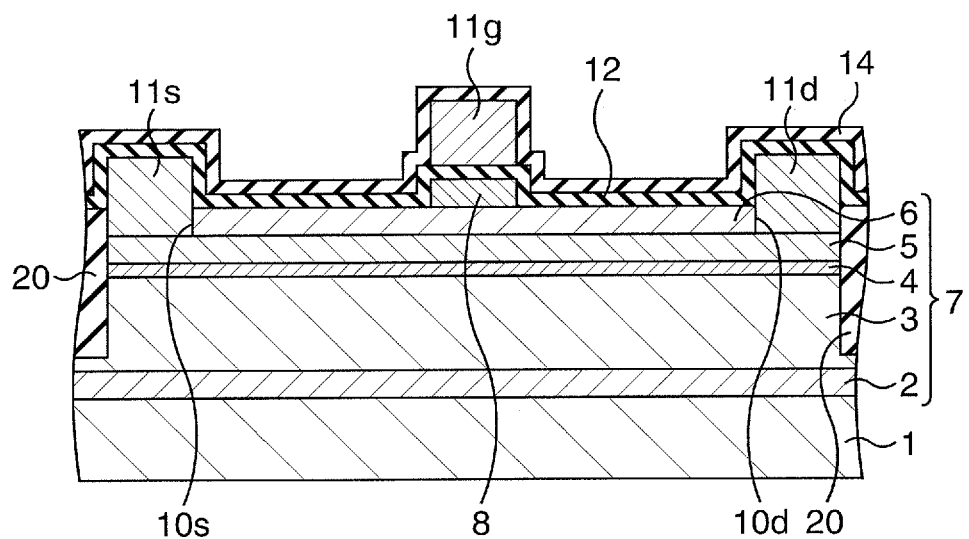
FIG. 3 is a cross sectional view illustrating a structure of a compound semiconductor device according to a second embodiment.

Next, a second embodiment will be explained. FIG. 3 is a cross sectional view illustrating a structure of a GaN-based HEMT (compound semiconductor device) according to the second embodiment.

In contrast to the first embodiment, having the gate electrode 11g brought into Schottky contact with the compound semiconductor stacked structure 7, the second embodiment adopts the insulating film 12 between the gate electrode 11g and the compound semiconductor stacked structure 7, so as to allow the insulating film 12 to function as a gate insulating film. In short, the opening 13g is not formed in the insulating film 12, and a MIS-type structure is adopted.

Also the second embodiment thus configured successfully achieves, similarly to the first embodiment, the effect of achieving the normally-off operation while suppressing the resistivity to a low level, with the presence of the p-type semiconductor layer 8.

A material for the insulating film 12 is not specifically limited, wherein the preferable examples include oxide, nitride or oxynitride of Si, Al, Hf, Zr, Ti, Ta and W. Aluminum oxide is particularly preferable. Thickness of the insulating film 12 may be 2 nm to 200 nm, and 10 nm or around, for example.

(Third Embodiment)

Figure 4:
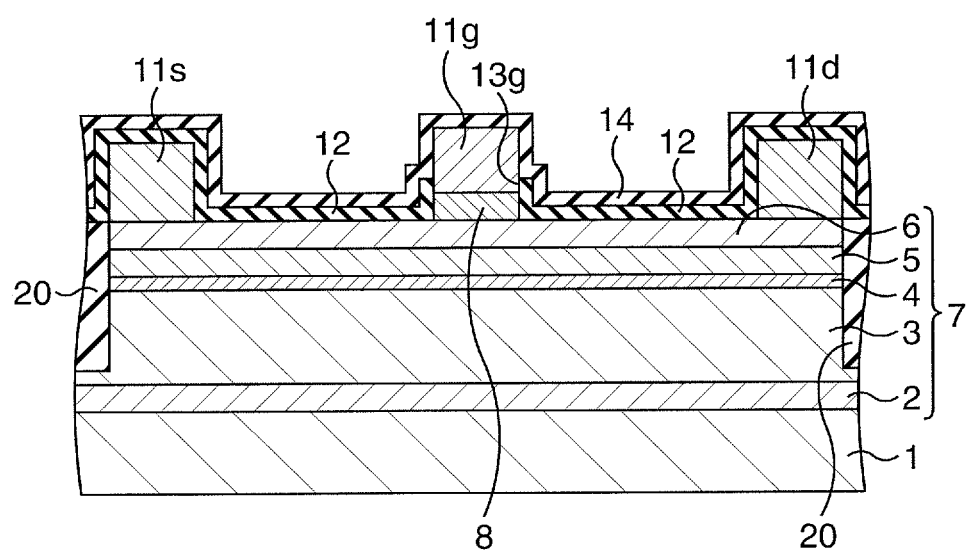
FIG. 4 is a cross sectional view illustrating a structure of a compound semiconductor device according to a third embodiment.

Next, a third embodiment will be explained. FIG. 4 is a cross sectional view illustrating a structure of a GaN-based HEMT (compound semiconductor device) according to the third embodiment.

In contrast to the first embodiment, having the source electrode 11s and the drain electrode 11d formed in the openings 10s and 10d respectively, the openings 10s and 10d are not formed in the third embodiment. The source electrode 11s and the drain electrode 11d are formed on the cap layer 6.

Also the third embodiment thus configured successfully achieves, similarly to the first embodiment, the effect of achieving the normally-off operation while suppressing the resistivity to a low level, with the presence of the p-type semiconductor layer 8.

(Fourth Embodiment)

Figure 5:
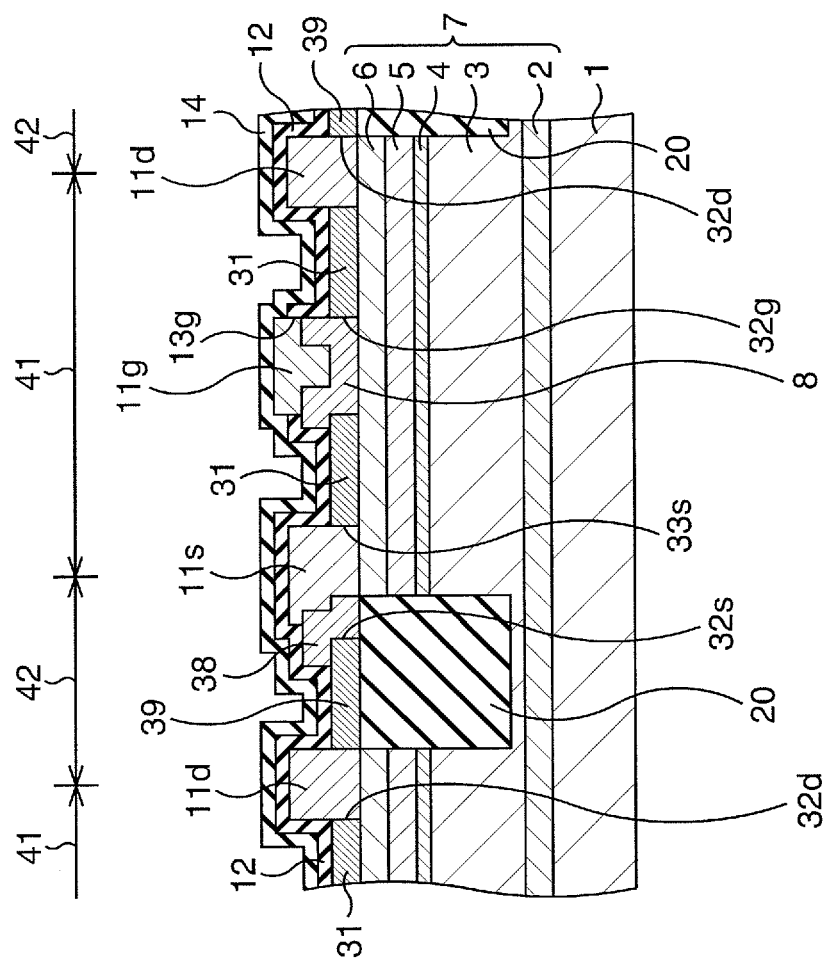
FIG. 5 is a cross sectional view illustrating a structure of a compound semiconductor device according to a fourth embodiment.

Next, a fourth embodiment will be explained. FIG. 5 is a cross sectional view illustrating a compound semiconductor device according to the fourth embodiment.

In the fourth embodiment, the source electrode 11s and the drain electrode 11d are formed on the cap layer 6, similarly to the third embodiment. An N-type semiconductor layer 31 is formed on the cap layer 6 in a region between the p-type semiconductor layer 8 and the source electrode 11s, and in a region between the p-type semiconductor layer 8 and the drain electrode 11d in the element region. The re-type semiconductor layer 31 may be an amorphous SiC layer of approximately 100 nm thick, doped with approximately $5 \times 10^{17}/cm^3$ of N (nitrogen) as an n-type impurity, for example. In this way, a transistor region 41 which has the n-type semiconductor layer 31 formed in the element region is provided.

In addition, on the element isolation region 20, a p-type semiconductor layer 38 brought into contact with the source electrode 11s, and an n-type semiconductor layer 39 brought into contact with the drain electrode 11d are formed, and the p-type semiconductor layer 38 and the n-type semiconductor layer 39 are brought into contact with each other. The p-type semiconductor layer 38 may be similar to the p-type semiconductor layer 8, and the n-type semiconductor layer 39 may be similar to the n-type semiconductor layer 31, for example. In this way, a body diode region 42 in which the p-type semiconductor layer 38 functions as an anode and the n-type semiconductor layer 39 functions as a cathode is provided. The other aspects of the structure are same as those in the first embodiment.

Note that, there are a plurality of transistor regions 41 and body diode regions 42, and that the gate electrodes 11g, the source electrodes 11s and the drain electrodes 11d contained in the individual transistor regions 41 are commonly connected among the plurality of transistor regions 41. Accordingly, the p-type semiconductor layer 38 and the n-type semiconductor layer 39 in each transistor region 41 are understood to be connected respectively to the source electrode 11s and the drain electrode 11d in each transistor region 41.

In the fourth embodiment, since the n-type semiconductor layer 31 resides, in planar view, in the region between the p-type semiconductor layer 8 and the source electrode 11s, and in the region between the p-type semiconductor layer 8 and the drain electrode 11d, so that the energy band in the surficial portion of the electron channel layer 3 is brought down from the level attained in the first embodiment. As a result, the concentration of the 2DEG in these regions elevates, to thereby further decrease the resistivity. Since the body diode region 42 includes a pn diode, a high level of breakdown voltage may be ensured. While the n-type impurity contained in the n-type semiconductor layer 31 may be same as that being contained in either of the electron channel layer 3 and the electron supply layer 5, other elements may be also adoptable.

Next, a method of manufacturing the compound semiconductor device according to the fourth embodiment will be explained. FIGS. 6A to 6H are cross sectional views illustrating, in sequence, a method of manufacturing a compound semiconductor device according to the fourth embodiment.

Figure 6A:
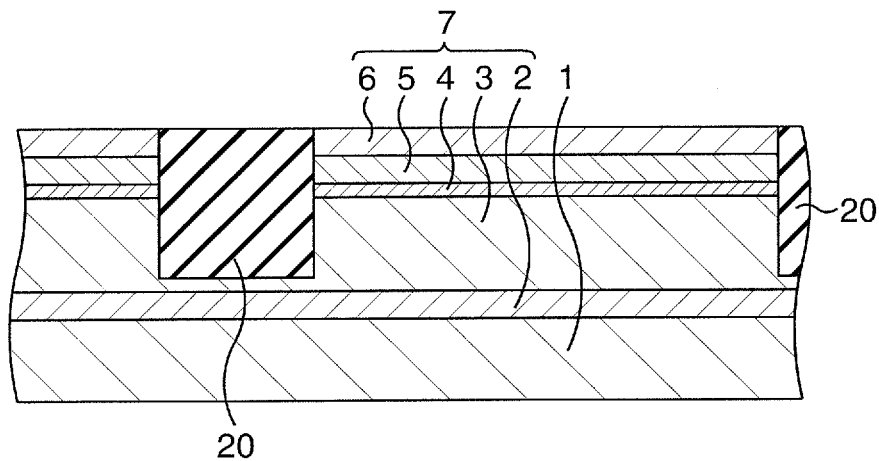
Figure 6B:
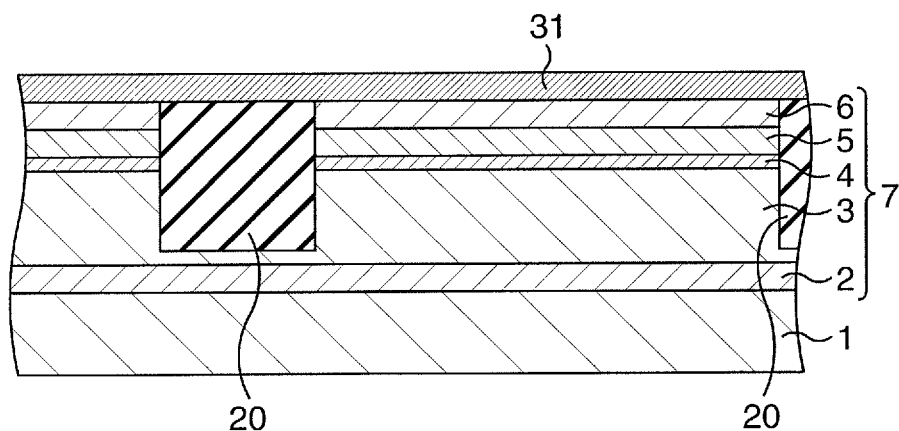

First, as illustrated in FIG. 6A, the processes up to the formation of the element isolation region 20 are conducted similarly to the first embodiment. Next, as illustrated in FIG. 6B, the n-type semiconductor layer 31 is formed over the entire surface. The n-type semiconductor layer 31 may be an amorphous SiC layer doped with approximately $1 \times 10^{17}/cm^3$ to $1 \times 10^{19}/cm^3$ of nitrogen (N), $5 \times 10^{17}/cm^3$ for example, of nitrogen (N). The n-type semiconductor layer 31 may be formed by a catalytic chemical vapor deposition (hot-wire CVD) process using a mixed gas of $SiH_4$ (silane) and $CH_4$ (methane) as a source material. Once the n-type semiconductor layer 31 is formed, the concentration of the 2DEG existing in the surficial portion of the electron channel layer 3 increases.

Figure 6C:
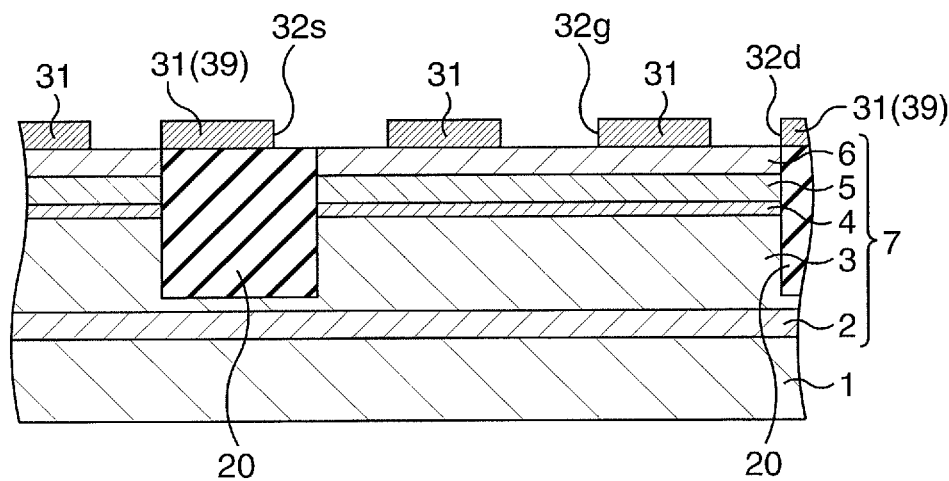

Thereafter, as illustrated in FIG. 6C, an opening 32s for the source electrode and the anode, an opening 32d for the drain electrode 32d, and an opening 32g for the gate electrode are formed in the n-type semiconductor layer 31. In a process of formation of the openings 32s, 32d and 32g, a photoresist pattern is formed on the n-type semiconductor layer 31 so as to expose regions where the openings 32s, 32d and 32g are to be formed, and the n-type semiconductor layer 31 is then etched using the photoresist pattern as an etching mask, for example. As a result, in the element region, the concentration of the 2DEG decreases, in the region thereof below the openings 32s, 32d and 32g, down to a level comparable to the level having been attained before the n-type semiconductor layer 31 is formed. A portion of the n-type semiconductor layer 31 remained on the element isolation region 20 and in a region where the cathode is to be formed corresponds to the n-type semiconductor layer 39 in FIG. 5.

Next, as illustrated in FIG. 6D, the p-type semiconductor layer 8 is formed over the entire surface, similarly as described in the first embodiment. Once the p-type semiconductor layer 8 grows, the concentration of the 2DEG existing in the surficial portion of the electron channel layer 3 largely decreases.

Next, as illustrated in FIG. 6E, the p-type semiconductor layer 8 is removed, but excluding a portion thereof on which the gate electrode is to be formed, and a portion thereof which is expected to serve later as the anode. As a result, the 2DEG remains to be considerably decreased in the concentration, or to vanish, for example, below the remained portion of the p-type semiconductor layer 8, whereas the 2DEG appears again at a high concentration in the surficial portion of the electron channel layer 3, which is comparable to the level having been attained before the p-type semiconductor layer 8 is formed, in the region where the p-type semiconductor layer 8 is removed. A portion of the p-type semiconductor layer 8 remained in a region where the anode is to be formed corresponds to the p-type semiconductor layer 38 in FIG. 5.

Thereafter, as illustrated in FIG. 6F, the source electrode 11s is formed in the opening 32s, and the drain electrode 11d is formed in the opening 32d. Next, annealing is conducted, for example, in a nitrogen atmosphere at 400° C. to 1000° C. (at 550° C., for example) to thereby ensure ohmic characteristic. The insulating film 12 is then formed over the entire surface.

Figure 6G:
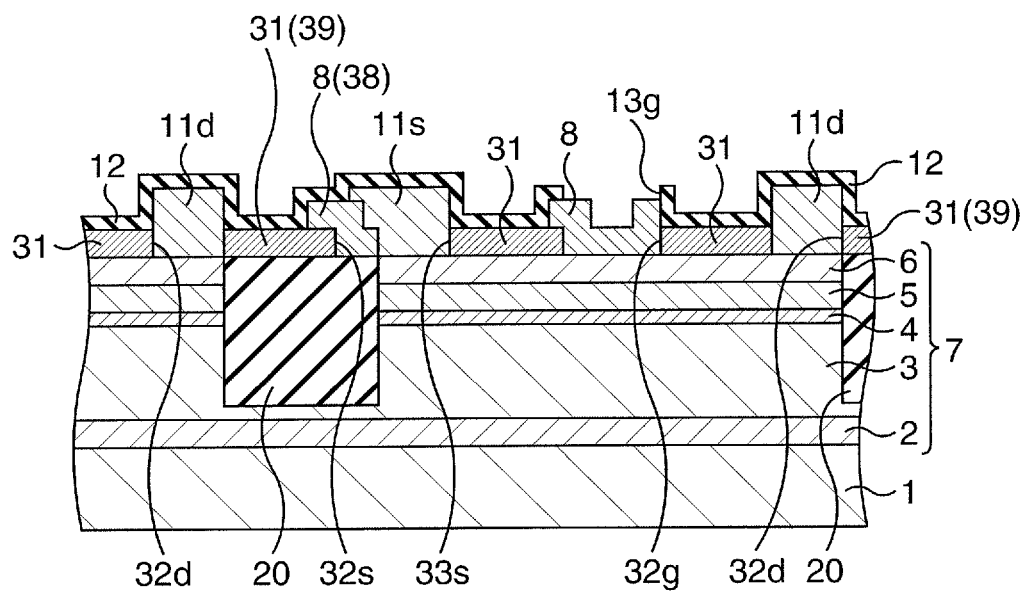

Next, as illustrated in FIG. 6G, the opening 13g is formed in the insulating film 12, so as to expose therein the p-type semiconductor layer 8.

Figure 6H:
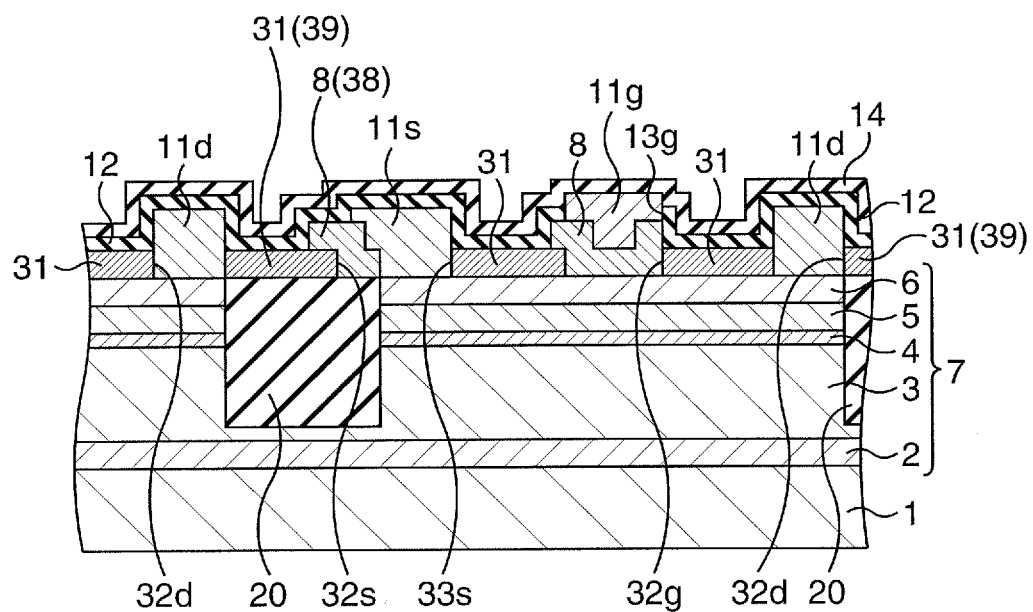

Next, as illustrated in FIG. 6H, the gate electrode 11g is formed in the opening 13g. The insulating film 14 is then formed over the insulating film 12 so as to cover the gate electrode 11g.

The GaN-based HEMT according to the fourth embodiment may be thus manufactured.

(Fifth Embodiment)

Figure 7:
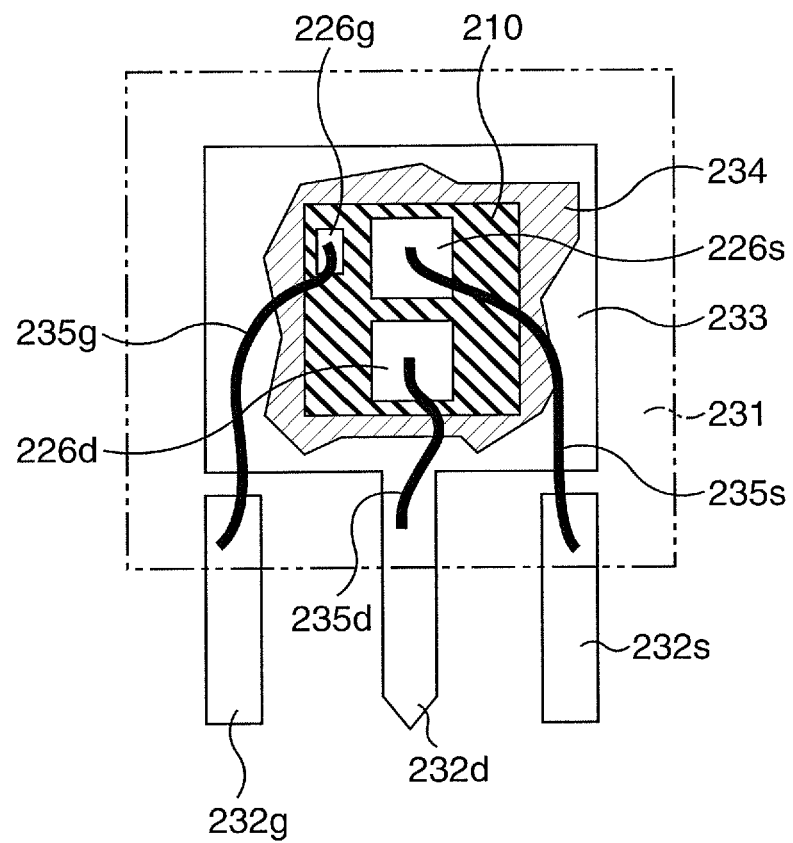
FIG. 7 is a drawing illustrating a discrete package according to a fifth embodiment.

A fifth embodiment relates to a discrete package of a compound semiconductor device which includes the GaN-based HEMT. FIG. 7 is a drawing illustrating the discrete package according to the fifth embodiment.

In the fifth embodiment, as illustrated in FIG. 7, a back surface of a HEMT chip 210 of the compound semiconductor device according to any one of the first to fourth embodiments is fixed on a land (die pad) 233, using a die attaching agent 234 such as solder. One end of a wire 235d such as an Al wire is bonded to a drain pad 226d, to which the drain electrode 11d is connected, and the other end of the wire 235d is bonded to a drain lead 232d integral with the land 233. One end of a wire 235s such as an Al wire is bonded to a source pad 226s, to which the source electrode 11s is connected, and the other end of the wire 235s is bonded to a source lead 232s separated from the land 233. One end of a wire 235g such as an Al wire is bonded to a gate pad 226g, to which the gate electrode 11g is connected, and the other end of the wire 235g is bonded to a gate lead 232g separated from the land 233. The land 233, the HEMT chip 210 and so forth are packaged with a molding resin 231, so as to project outwards a portion of the gate lead 232g, a portion of the drain lead 232d, and a portion of the source lead 232s.

The discrete package may be manufactured by the procedures below, for example. First, the HEMT chip 210 is bonded to the land 233 of a lead frame, using a die attaching agent 234 such as solder. Next, with the wires 235g, 235d and 235s, the gate pad 226g is connected to the gate lead 232g of the lead frame, the drain pad 226d is connected to the drain lead 232d of the lead frame, and the source pad 226s is connected to the source lead 232s of the lead frame, respectively, by wire bonding. Then molding with the molding resin 231 is conducted by a transfer molding process. The lead frame is then cut away.

(Sixth Embodiment)

Figure 8:
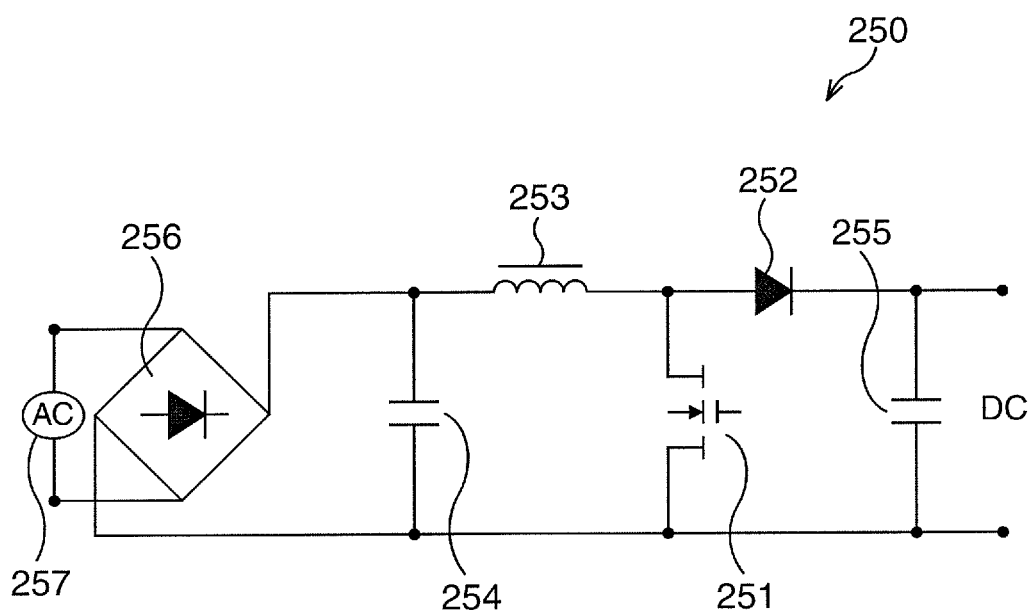
FIG. 8 is a wiring diagram illustrating a power factor correction (PFC) circuit according to a sixth embodiment.

Next, a sixth embodiment will be explained. The sixth embodiment relates to a PFC (power factor correction) circuit equipped with a compound semiconductor device which includes a GaN-based HEMT. FIG. 8 is a wiring diagram illustrating the PFC circuit according to the sixth embodiment.

The PFC circuit 250 includes a switching element (transistor) 251, a diode 252, a choke coil 253, capacitors 254 and 255, a diode bridge 256, and an AC power source (AC) 257. The drain electrode of the switching element 251, the anode terminal of the diode 252, and one terminal of the choke coil 253 are connected with each other. The source electrode of the switching element 251, one terminal of the capacitor 254, and one terminal of the capacitor 255 are connected with each other. The other terminal of the capacitor 254 and the other terminal of the choke coil 253 are connected with each other. The other terminal of the capacitor 255 and the cathode terminal of the diode 252 are connected with each other. A gate driver is connected to the gate electrode of the switching element 251. The AC 257 is connected between both terminals of the capacitor 254 via the diode bridge 256. A DC power source (DC) is connected between both terminals of the capacitor 255. In the embodiment, the compound semiconductor device according to any one of the first to fourth embodiments is used as the switching element 251.

In the process of manufacturing the PFC circuit 250, for example, the switching element 251 is connected to the diode 252, the choke coil 253 and so forth with solder, for example.

(Seventh Embodiment)

Figure 9:
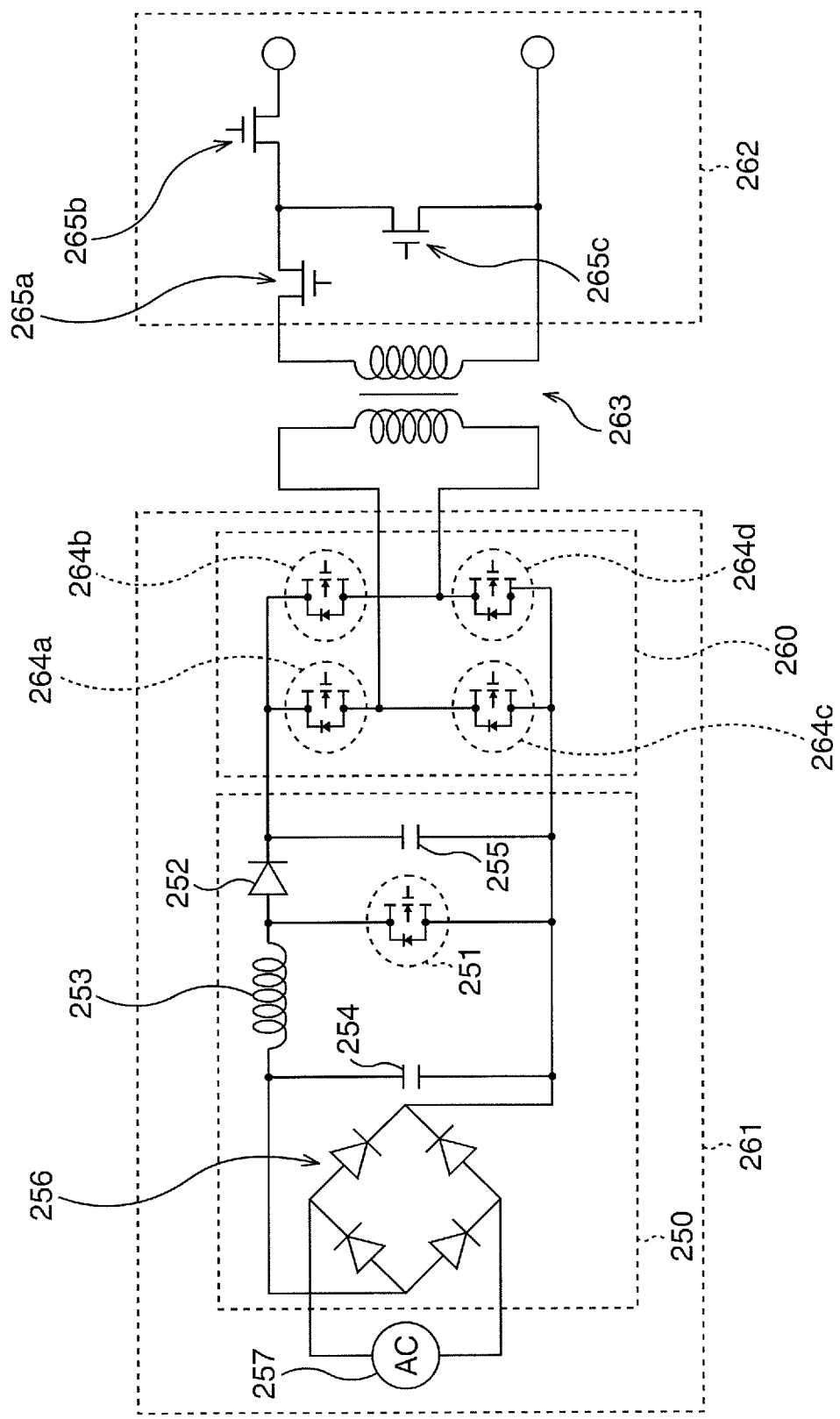
FIG. 9 is a wiring diagram illustrating a power supply apparatus according to a seventh embodiment.

Next, a seventh embodiment will be explained. The seventh embodiment relates to a power supply apparatus equipped with a compound semiconductor device which includes a GaN-based HEMT. FIG. 9 is a wiring diagram illustrating the power supply apparatus according to the seventh embodiment.

The power supply apparatus includes a high-voltage, primary-side circuit 261, a low-voltage, secondary-side circuit 262, and a transformer 263 arranged between the primary-side circuit 261 and the secondary-side circuit 262.

The primary-side circuit 261 includes the PFC circuit 250 according to the sixth embodiment, and an inverter circuit, which may be a full-bridge inverter circuit 260, for example, connected between both terminals of the capacitor 255 in the PFC circuit 250. The full-bridge inverter circuit 260 includes a plurality of (four, in the embodiment) switching elements 264a, 264b, 264c and 264d.

The secondary-side circuit 262 includes a plurality of (three, in the embodiment) switching elements 265a, 265b and 265c.

In the embodiment, the compound semiconductor device according to any one of the first to fourth embodiments is used for the switching elements 251 of the PFC circuit 250, and for the switching elements 264a, 264b, 264c and 264d of the full-bridge inverter circuit 260. The PFC circuit 250 and the full-bridge inverter circuit 260 are components of the primary-side circuit 261. On the other hand, a silicon-based general MIS-FET (field effect transistor) is used for the switching elements 265a, 265b and 265c of the secondary-side circuit 262.

(Eighth Embodiment)

Figure 10:
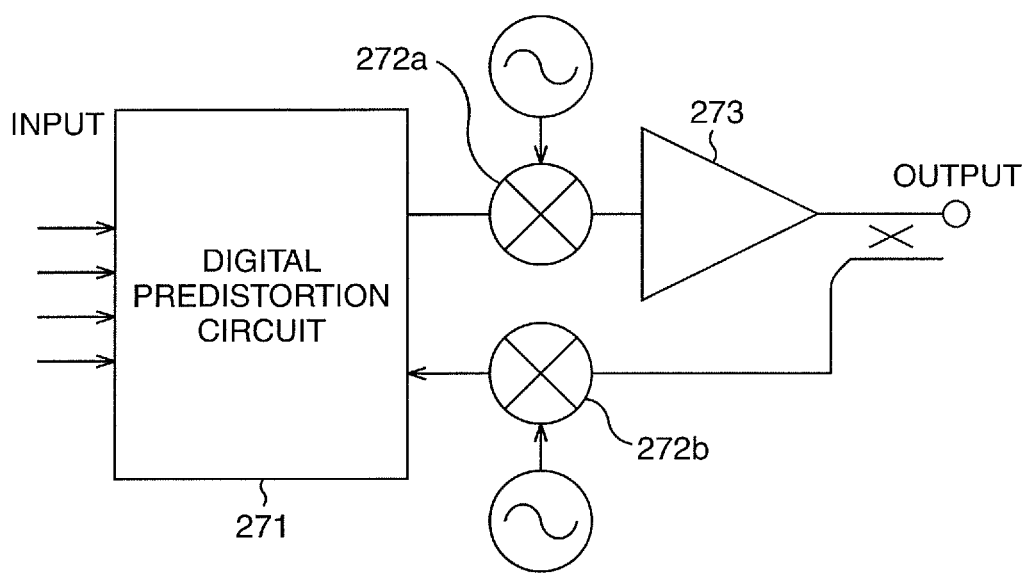
FIG. 10 is a wiring diagram illustrating a high-frequency amplifier according to an eighth embodiment.

Next, an eighth embodiment will be explained. The eighth embodiment relates to a high-frequency amplifier equipped with a compound semiconductor device which includes a GaN-based HEMT. FIG. 10 is a wiring diagram illustrating the high-frequency amplifier according to the eighth embodiment.

The high-frequency amplifier includes a digital predistortion circuit 271, mixers 272a and 272b, and a power amplifier 273.

The digital predistortion circuit 271 compensates non-linear distortion in input signals. The mixer 272a mixes the input signal having the non-linear distortion already compensated, with an AC signal. The power amplifier 273 includes the compound semiconductor device according to any one of the first to fourth embodiments, and amplifies the input signal mixed with the AC signal. In the illustrated example of the embodiment, the signal on the output side may be mixed, upon switching, with an AC signal by the mixer 272b, and may be sent back to the digital predistortion circuit 271.

Composition of the compound semiconductor layers used for the compound semiconductor stacked structure is not specifically limited, and GaN, AlN, InN and so forth may be used. Also mixed crystals of them may be used.

In the embodiments, the substrate may be a silicon carbide (SiC) substrate, a sapphire substrate, a silicon substrate, a GaN substrate, a GaAs substrate or the like. The substrate may be any of electro-conductive, semi-insulating, and insulating ones.

Configurations of the gate electrode, the source electrode and the drain electrode are not limited to those in the above-described embodiments. For example, they may be configured by a single layer. The method of forming these electrodes is not limited to the lift-off process. The annealing after the formation of the source electrode and the drain electrode may be omissible, so long as the ohmic characteristic is obtainable. The gate electrode may be annealed.

The thickness and materials for composing the individual layers are not limited to those described in the embodiments.

According to the compound semiconductor devices and so forth described above, the normally-off operation can be achieved while suppressing degradation in the characteristics, with the presence of the appropriate p-type semiconductor layer between the gate electrode and the electron supply layer.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising:
a substrate;
an electron channel layer and an electron supply layer formed over the substrate;
a gate electrode, a source electrode and a drain electrode formed on or above the electron supply layer;
a p-type semiconductor layer formed between the electron supply layer and the gate electrode; and
an n-type semiconductor layer formed a above the electron supply layer, and at least between the gate electrode and the source electrode, and between the gate electrode and the drain electrode,
wherein the p-type semiconductor layer contains, as a p-type impurity, an element same as that being contained in at least either of the electron channel layer and the electron supply layer, and
wherein the n-type semiconductor layer contains, as an n-type impurity, an element same as that being contained in at least either of the electron channel layer and the electron supply layer.

2. The compound semiconductor device according to claim 1, wherein the p-type semiconductor layer is a SiC layer which contains a p-type impurity.

3. The compound semiconductor device according to claim 2, wherein the SiC layer is in an amorphous state.

4. The compound semiconductor device according to claim 1, wherein the p-type impurity is Al or Ga.

5. The compound semiconductor device according to claim 1, wherein the n-type impurity contained in the n-type semiconductor layer is nitrogen (N).

6. The compound semiconductor device according to claim 1, further comprising a pn-junction diode, which comprises a second p-type semiconductor layer connected to the source electrode and a second n-type semiconductor layer connected to the drain electrode, wherein the second p-type semiconductor layer contains, as a p-type impurity, an element same as that being contained in at least either of the electron channel layer and the electron supply layer, and the second n-type semiconductor layer contains, as an n-type impurity, an element same as that being contained in at least either of the electron channel layer and the electron supply layer.

7. A power supply apparatus comprising
a compound semiconductor device, which comprises:
a substrate;
an electron channel layer and an electron supply layer formed over the substrate;
a gate electrode, a source electrode and a drain electrode formed on or above the electron supply layer;
a p-type semiconductor layer formed between the electron supply layer and the gate electrode; and
an n-type semiconductor layer formed above the electron supply layer, and at least between the fate electrode and the source electrode, and between the gate electrode and the drain electrode,
wherein the p-type semiconductor layer contains, as a p-type impurity, an element same as that being contained in at least either of the electron channel layer and the electron supply layer, and
wherein the n-type semiconductor layer contains, as a n-type impurity, an element same as that being contained in at least either of the electron channel layer and the electron supply layer, and 8. An amplifier comprising
a compound semiconductor device, which comprises:
a substrate;
an electron channel layer and an electron supply layer formed over the substrate;
a gate electrode, a source electrode and a drain electrode formed on or above the electron supply layer; and
a p-type semiconductor layer formed between the electron supply layer and the gate electrode; and
an n-type semiconductor layer formed above the electron supply layer, and at least between the gate electrode and the source electrode, and between the gate electrode and the drain electrode,
wherein the p-type semiconductor layer contains, as a p-type impurity, an element same as that being contained in at least either of the electron channel layer and the electron supply layer, and
wherein the n-type semiconductor layer contains, as an n-type impurity, an element same as that being contained in at least either of the electron channel layer and the electron supply layer.

9. A method of manufacturing a compound semiconductor device, comprising:
forming an electron channel layer and an electron supply layer over a substrate;
forming a p-type semiconductor layer above the electron supply layer;
forming a source electrode and a drain electrode on or above the electron supply layer, at positions in planar view placing the p-type semiconductor layer in between;
forming a gate electrode on the p-type semiconductor layer; and
forming an n-type semiconductor layer above the electron supply layer, and at least between the gate electrode and the source electrode, and between the gate electrode and the drain electrode,
wherein the p-type semiconductor layer contains, as a p-type impurity, an element same as that being contained in at least either of the electron channel layer and the electron supply layer, and
wherein the n-type semiconductor layer contains, as an n-type impurity, an element same as that being contained in at least either of the electron channel layer and the electron supply layer.

10. The method of manufacturing a compound semiconductor device according to claim 9, wherein the p-type semiconductor layer is a SiC layer which contains a p-type impurity.

11. The method of manufacturing a compound semiconductor device according to claim 10, wherein the SiC layer is in an amorphous state.

12. The method of manufacturing a compound semiconductor device according to claim 9, wherein the p-type impurity is Al or Ga.

13. The method of manufacturing a compound semiconductor device according to claim 9, wherein the n-type impurity contained in the n-type semiconductor layer is nitrogen (N).

14. The method of manufacturing a compound semiconductor device according to claim 9, further comprising forming a pn-junction diode, which comprises a second p-type semiconductor layer connected to the source electrode, and a second n-type semiconductor layer connected to the drain electrode, wherein the second p-type semiconductor layer contains, as a p-type impurity, an element same as that being contained in at least either of the electron channel layer and the electron supply layer, and the second n-type semiconductor layer contains, as an n-type impurity, an element same as that being contained in at least either of the electron channel layer and the electron supply layer.

* * * * *